United States Patent
Vogelsang et al.

(10) Patent No.: US 12,001,697 B2
(45) Date of Patent: Jun. 4, 2024

(54) MULTI-MODAL REFRESH OF DYNAMIC, RANDOM-ACCESS MEMORY

(71) Applicant: Rambus Inc., San Jose, CA (US)

(72) Inventors: Thomas Vogelsang, Mountain View, CA (US); Steven C. Woo, Saratoga, CA (US); Michael Raymond Miller, Raleigh, NC (US)

(73) Assignee: Rambus Inc., San Jose, CA (US)

( * ) Notice: Subject to any disclaimer, the term of this patent is extended or adjusted under 35 U.S.C. 154(b) by 84 days.

(21) Appl. No.: 17/503,058

(22) Filed: Oct. 15, 2021

(65) Prior Publication Data

US 2022/0137843 A1    May 5, 2022

Related U.S. Application Data

(60) Provisional application No. 63/109,743, filed on Nov. 4, 2020.

(51) Int. Cl.
*G06F 3/00* (2006.01)
*G06F 3/06* (2006.01)

(52) U.S. Cl.
CPC ............ *G06F 3/0634* (2013.01); *G06F 3/061* (2013.01); *G06F 3/0673* (2013.01)

(58) Field of Classification Search
None
See application file for complete search history.

(56) References Cited

U.S. PATENT DOCUMENTS

| | | | |
|---|---|---|---|
| 5,487,172 A * | 1/1996 | Hyatt | G06F 13/16 700/8 |
| 6,292,426 B1 | 9/2001 | Ikeda et al. | |
| 7,565,480 B2 * | 7/2009 | Ware | G11C 11/40603 711/105 |
| 7,885,134 B2 | 2/2011 | Li et al. | |
| 8,176,241 B2 | 5/2012 | Hearn | |
| 8,797,822 B2 | 2/2014 | Sato | |
| 2007/0195613 A1 | 8/2007 | Rajan et al. | |
| 2011/0131371 A1 | 6/2011 | Sun et al. | |
| 2013/0132704 A1 | 5/2013 | Ware et al. | |
| 2021/0241810 A1 * | 8/2021 | Hollis | G11C 11/406 |

OTHER PUBLICATIONS

Chang et al., "Improving DRAM Performance by Parallelizing Refreshes with Accesses," Carnegie Mellon University 2014 (12 pages).
Elpida, "Low Power Function of Mobile RAM Partial Array Self Refresh (PASR)," Technical Note, Document No. E0597E10 (Ver. 1.0), Elpida Memory, Inc., 2005 (5 pages).
Bhati et al., "DRAM Refresh Mechanisms, Penalties, and Trade-Offs," IEEE Transactions on Computers, 2015 (14 pages).

* cited by examiner

*Primary Examiner* — Midys Rojas
(74) *Attorney, Agent, or Firm* — Silicon Edge Law Group LLP; Arthur J. Behiel

(57) ABSTRACT

A memory system includes two or more memory controllers capable of accessing the same dynamic, random-access memory (DRAM), one controller having access to the DRAM or a subset of the DRAM at a time. Different subsets of the DRAM are supported with different refresh-control circuitry, including respective refresh-address counters. Whichever controller has access to a given subset of the DRAM issues refresh requests to the corresponding refresh-address counter. Counters are synchronized before control of a given subset of the DRAM is transferred between controllers to avoid a loss of stored data.

19 Claims, 13 Drawing Sheets

MULTI-MODAL REFRESH OF DYNAMIC, RANDOM-ACCESS MEMORY

BACKGROUND

Dynamic, random-access memory (DRAM) includes storage cells that require their contents to be periodically refreshed. This is because information is held as charge across a capacitor, charge that leaks away over time. To prevent this leakage from destroying the information, the contents of each cell is periodically read and rewritten to restore the original amount of charge. Leaky buckets provide an apt analogy. Imagine storing a string of ones and zeros using a collection of leaky buckets, filling buckets to store a one and draining buckets to store a zero. If one were to wait too long, all the buckets would be empty and the stored ones lost. To preserve the ones, one might revisit each bucket from time to time to top off the partially filled buckets, and thus "refresh" the full value representing a one. The analogy weakens when one considers that modern DRAM devices have billions of such "buckets." Managing refresh operations without losing data or unduly interfering with read and write operations is complicated, more so when refresh operations for a given quantity of DRAM are managed by multiple controllers with access to the same DRAM.

DETAILED DESCRIPTION

Figure 1:
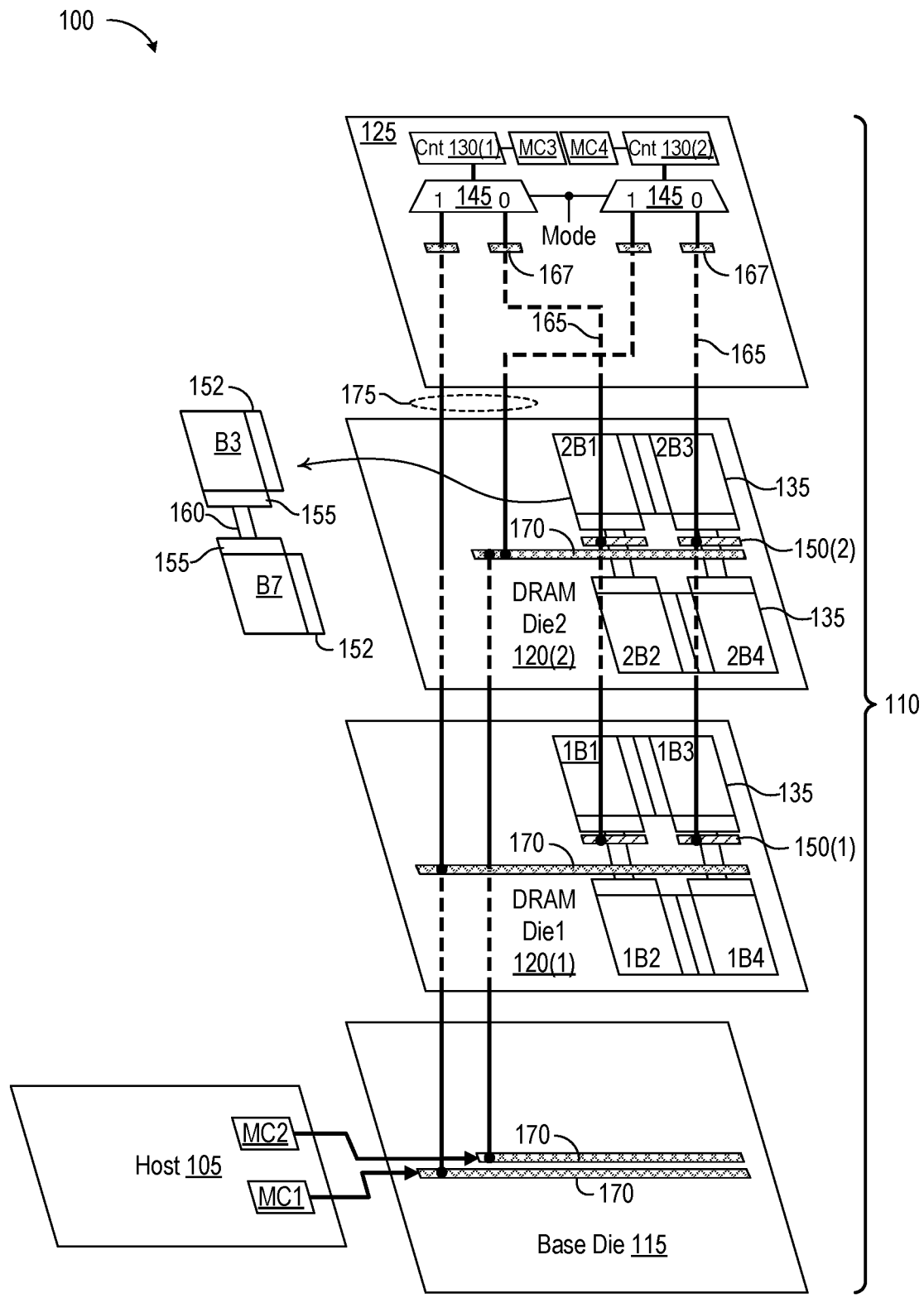
FIG. 1 illustrates a memory system 100 in which a host (e.g. a memory controller) 105 reads from and writes to DRAM memory in a three-dimensional (3D) stack 110.

FIG. 1 illustrates a memory system 100 in which a host 105 with memory controller MC1 and MC2 reads from and writes to DRAM memory in a three-dimensional (3D) stack 110 that includes a base die 115, DRAM dies 120, and a processing die 125. Processing die 125 includes address counters 130 and other elements that assist host 105 in managing refresh operations for arrays of memory banks 135 on DRAM dies 120. Processing die 125 also includes local memory controllers MC3 and MC4 that, in a mode selected using demultiplexers 145, can take over refresh management from all or a portion of memory banks 135, thus freeing host 105 for other tasks.

Each DRAM bank 135 is labeled to include a leading number indicative of the DRAM die and a trailing number indicative of the bank. "2B1" thus refers to the first DRAM bank on the second DRAM die. Each pair of banks 135 includes a request interface 150 to a row decoder 152 and a column decoder 155. Links 160 to each pair of banks communicate requests and data. Ignoring the data, requests on links 160 are conveyed along inter-die connections 165 from request interface 150 to one of demultiplexers 145 and to a request interface 150 on an adjacent DRAM die 120. Inter-die connections 165 from demultiplexers 145 to a vertical stack of memory-bank pairs (a "slice" of memory banks) can be made using e.g. through-silicon vias (TSVs) or Cu-Cu connections 167. Intra-die connections 170 on each DRAM die 120 likewise communicate requests and data in the plane of each DRAM die 120. Intra-die connections 170 on base die 115 connect to host 105 and, by way of vertical connections 175, to DRAM dies 120 and demultiplexers 145 on processing die 125.

Memory system 100 supports multiple modes of DRAM refresh, two in this example. In a first mode, host memory controllers MC1 and MC2 manage refresh operations for banks 135 on respective DRAM dies 120(1) and 120(2). Host 105 selects this mode by loading a register (not shown) with a mode value Mode of one, which causes demultiplexers 145 to present bank addresses from counters 130(1) and 130(2) to connections 170 on respective DRAM dies 120(1) and 120(2). Host 105 initiates refresh transactions by issuing refresh requests to stack 110. Refresh circuitry on processing die 125 includes refresh counters 130(1) and 130(2), each of which contains the address of a row to be refreshed in a bank of the corresponding DRAM die 120. Counters 130 can be instantiated on other layers. Refresh operations can follow various strategies, including "burst refresh" in which all rows are refreshed in a burst or "distributed refresh" in which rows are tracked such that refresh operations can be interspersed with read and write accesses. Whatever the strategy, this first mode essentially treats the collection of banks 135 on each memory die 120 as an independent memory.

In the second mode, local memory controllers MC3 and MC4 manage refresh operations for vertical slices of banks 135 on DRAM dies 120(1) and 120(2). Host 105 selects this mode by loading a register (not shown) with a mode value Mode of zero, which causes demultiplexers 145 to present bank addresses from counters 130(1) and 130(2) to connections 165 that extend to a subset—e.g. two of four—of banks 135 on each of DRAM dies 120(1) and 120(2). Controllers MC3 and MC4 issue refresh requests that initiate refresh operations to row addresses specified by refresh counters 130(1) and 130(2). Controllers MC3 and MC4 can employ the same or different refresh strategies as controllers MC1 and MC2.

Processing die 125 is, in one embodiment, an accelerator die for a neural network that processes training data to derive machine-learning models. Host 105 can load DRAM dies 120 with training data, in the first mode, before placing stack 110 in the second mode to hand control over to processing die 125. Processing die 125 can then execute a learning algorithm that relies on the training data to derive a function or functions optimized to achieve a desired result (e.g., to classify images). During this "training" phase, memory controllers MC3 and MC4 can manage refresh and other memory transactions for processing die 125, eventually reporting the availability of derived model parameters or a time out to host 105. Host 105 can then take back control, including of refresh transactions, and read out the model parameters from DRAM dies 120. Learning algorithms can thus proceed with little or no interference from host 105, which can similarly direct a number of neural networks in tandem.

Rather than await a report from stack 110, host 105 can periodically read an error register (not shown) on stack 110 to monitor the progress of a learning algorithm. When the error or errors reaches a desired level, or fails to reduce further with time, processor host 105 can issue an instruction to stack 110 to return to the first mode and read out the optimized neural-network parameters—sometimes called a "machine-learning model"—and other data of interest.

In some embodiments stack 110 is only in one mode or the other. Other embodiments support more granular modality, allowing different banks to be directed by different external and internal memory controllers while avoiding bank conflicts. Embodiments that switch between modes to allow different controllers access to the same memory space support handoff protocols that ensure refresh operations are not postponed long enough to lose data between modes. Examples of protocols and supporting circuitry are detailed below.

Figure 2:
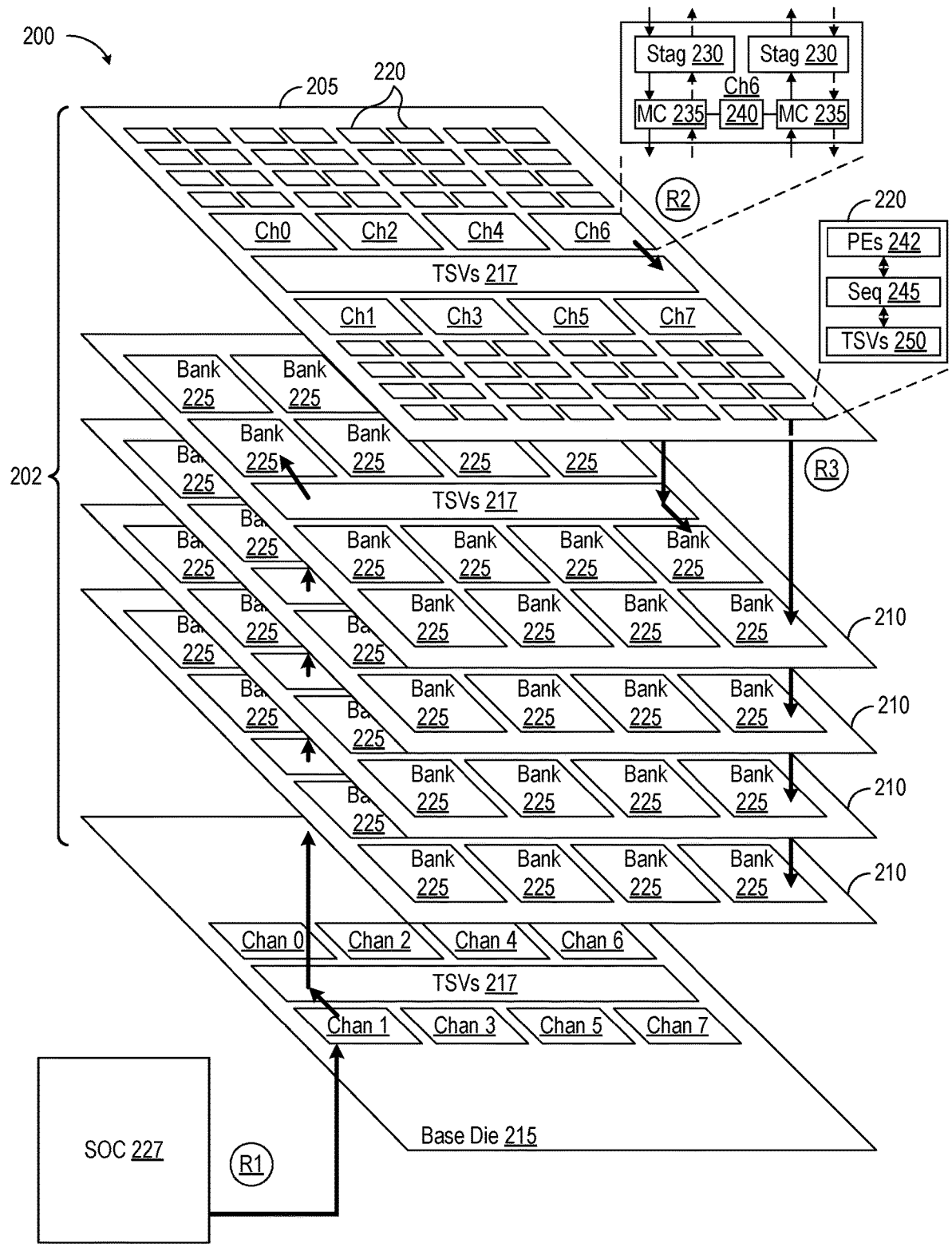
FIG. 2 illustrates a memory system 200 in accordance with another embodiment.

FIG. 2 illustrates a memory system 200 in accordance with another embodiment. An ASIC 202 includes a processing die 205 bonded to a stack of DRAM dies 210 and a base die 215. As used herein, the term "die" refers to an integrated-circuit die, a block of a semiconducting material, commonly silicon, upon and within which an integrated circuit is fabricated. In this example, processing die 205 incorporates an artificial neural network with an architecture that minimizes connection distances between processing units 220 and DRAM banks 225, and thus improves efficiency and performance, while supporting externally and internally directed refresh operations. An exemplary processing unit 220 is detailed below in connection with later figures. This illustration outlines three refresh modes that allow a system-on-a-chip (SOC) 227 external to ASIC 202 and processing units 220 internal to ASIC 202 to take turns managing refresh operations for banks 225.

Base die 215 includes a high-bandwidth memory (HBM) interface divided into four HBM sub-interfaces (not shown), each sub interface serving two of eight data channels Chan[7:0]. Using fields of TSVs 217 that extend through all intermediate dies, each data channel communicates with one of DRAM dies 210 and is supported by a corresponding request channel. SOC 227 can thus control read, write, and refresh operations independently for each DRAM die 210. A refresh operation compatible with conventional HBM memory operations, but using refresh circuitry to be detailed later, can be initiated by SOC 227 in the manner labeled R1, a bold arrow illustrating a refresh operation directed to a bank 225 in the uppermost DRAM die 210. Though not shown, address counters and related support for refresh operations are integrated within one or more dies of ASIC 202.

Processing die 205 includes eight channels Ch[7:0], one for each of corresponding HBM channels Chan[7:0], that allow requests and data to flow to and from processing units 220 using the same fields of TSVs 217 that afford access to SOC 227. Each channel Ch[7:0] includes a pair of staging buffers 230, a pair of memory controllers 235, and at least one address counter 240. Buffers 230 allow rate matching so that read and write data bursts from and to memory can be matched to regular, pipeline movement of an array of processing units 220. In this context, a "processing unit" is an electronic circuit that performs arithmetic and logic operations using local, on-die memory or data provided from one or more of the memory dies. Processing units can operate as a systolic array, in which case they can be "chained" together to form larger systolic arrays. Memory controller 235, including state machines or sequencers, can manage refresh operations and keep the processing pipeline running. Counter or counters 240 store addresses in support of refresh operations initiated by SOC 227, memory controllers 235, or by some other mechanism. A refresh operation initiated by one of memory controllers 235 is labeled R2 with a neighboring bold arrow illustrating a refresh operation directed to a bank 225 in the uppermost DRAM die 210.

Each processing units 220 additionally supports refresh operations in this embodiment. Each processing unit 220 includes an array of processing elements 242, a sequencer 245, and a TSV field 250 that connects to the data and request interfaces of each underlying DRAM bank 225. Though not shown, each processing unit 220 has refresh circuitry, including one or more address counters, to manage refresh operations for the underlying column of banks 225. In other embodiments, address counters and related overhead serve additional banks or collections of banks. A refresh operation initiated by one of processing units 220 is labeled R3 with a neighboring bold arrow illustrating a refresh operation directed to one or more banks 225 in the underlying vertical "slice." In other embodiments sequencer 245 can issue refresh instructions that make use of counts maintained in address counters 240.

ASIC 202 can support any one or a combination of refresh modes simultaneously. For example, SOC 227 can write training data or read resolved models from a portion of the available DRAM banks 225 as processing die 205 refines the model or works on another model using another portion.

Figure 3:
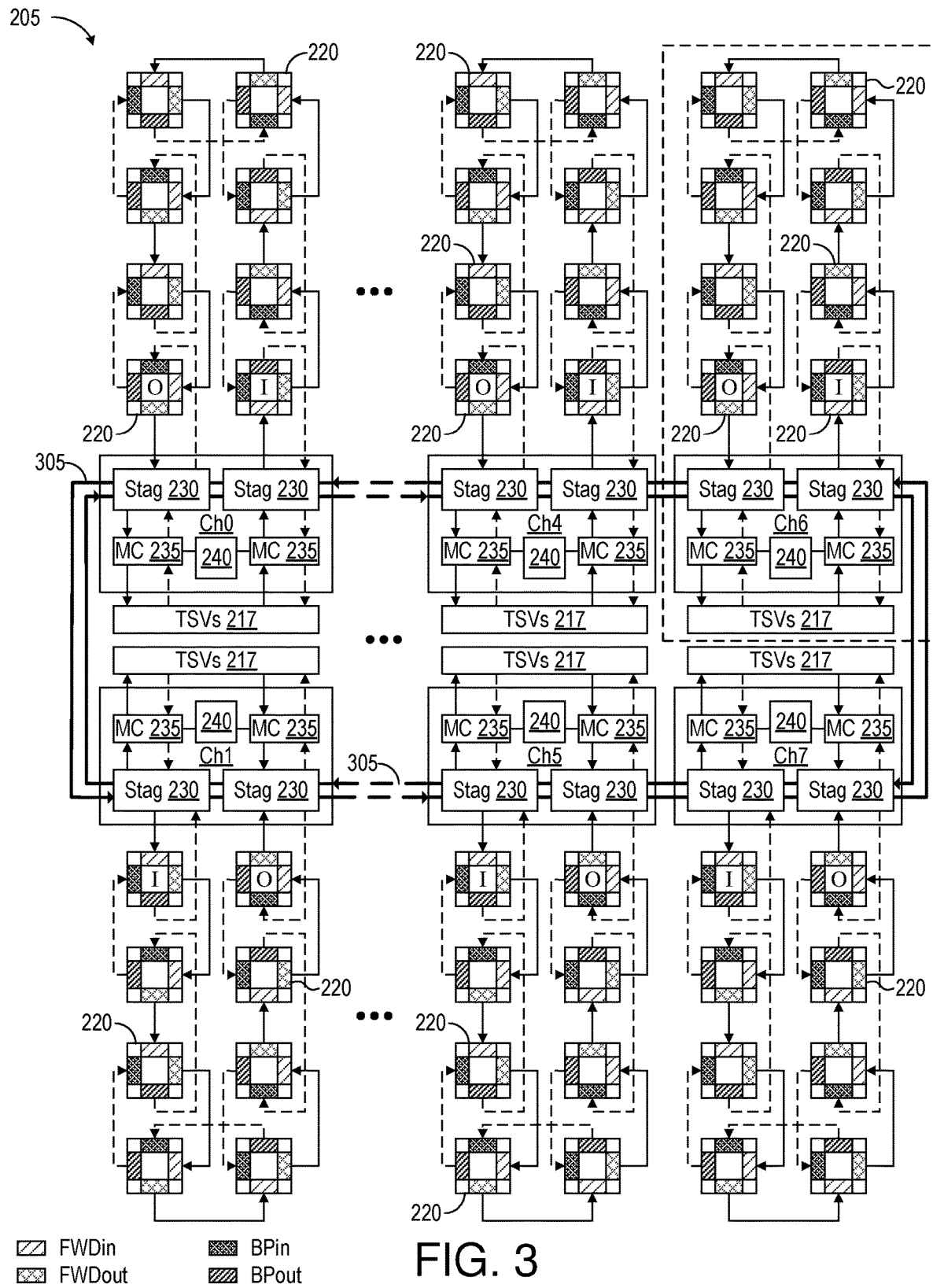
FIG. 3 is a plan view of an embodiment of processing die 205 of FIG. 2 for implementing an artificial neural network.

FIG. 3 is a plan view of an embodiment of processing die 205 of FIG. 2 for implementing an artificial neural network. Channels Ch[7:0] can be interconnected via one or more ring busses 305 for increased flexibility, for example to allow data from any channel to be sent to any tile, and to support use cases in which network parameters (e.g. weights and biases) are partitioned so that processing happens on portions of the neural network.

Processing units 220 can be described as "upstream" or "downstream" with respect to one another and with reference to signal flow in the direction of inference. Beginning with channel Ch6, the processing unit 220 labeled "I" (for "input") receives input from one of staging buffers 230. This input unit 220 is upstream from the next processing unit 220 toward the top. For inference, or "forward propagation," information moves along the unbroken arrows through the chain of units 220, emerging from the ultimate downstream unit labeled "O" (for "output") to another of staging buffers 230. For training, or "back propagation," information moves along the broken arrows from the ultimate downstream tile labeled "O," emerging from the ultimate upstream tile labeled "I."

Each processing unit 220 includes four ports, two each for forward propagation and back propagation. A key at the lower left of FIG. 3 shows shading that identifies in each unit 220 as a forward-propagation input port (FWDin), a forward-propagation output port (FWDout), a back-propagation input port (BPin), or a back-propagation output port (BPout). Units 220 are oriented to minimize inter-unit connection distances. Processing elements 242 (FIG. 2) in each processing unit 220 can concurrently process and update partial results from both upstream and downstream processing elements and tiles in support of concurrent forward and back propagation.

Figure 4:
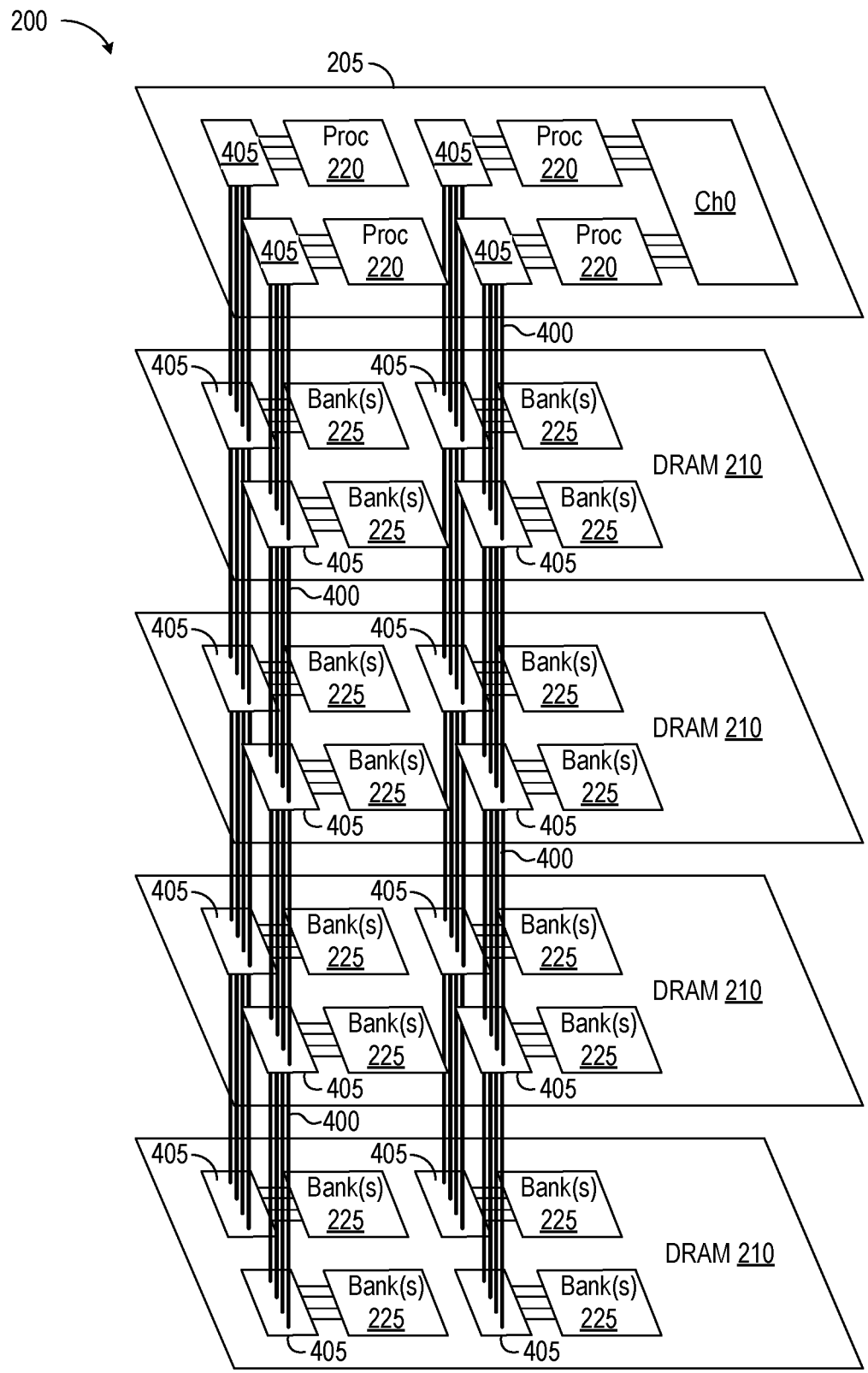
FIG. 4 depicts ASIC 202 of FIG. 2, less base die 215, to illustrate how inter-die connections 400 formed using via fields 405 and related intra-die connectivity can afford processing units 220 fast, efficient access to underlying banks 225.

FIG. 4 depicts ASIC 202 of FIG. 2, less base die 215, to illustrate how inter-die connections 400 formed using via fields 405 and related intra-die connectivity can afford processing units 220 fast, efficient access to underlying banks 225. As in the earlier examples, the layers are illustrated as separate but would be manufactured as stacked silicon wafers or dies interconnected using e.g. through-silicon vias (TSVs) or Cu-Cu connections so that the stack behaves as a single IC. The dies can be separate or in separate stacks in other embodiments. Banks 225 form a high-bandwidth memory with vertical slices for storing e.g. training data, partial results, and machine-learning models calculated during machine learning. Banks 225 can be complete banks or portions of banks (e.g. mats of bit cells). Each processing unit 220 can be equipped with a relatively simple memory controller—e.g. an address sequencer with refresh counter—that supports memory-access (read and write) and refresh operations. In other embodiments, each processing unit 220 can include a memory controller that manages refresh counters shared by more than one processing unit, such as controllers 235 of FIG. 2.

Figure 5:
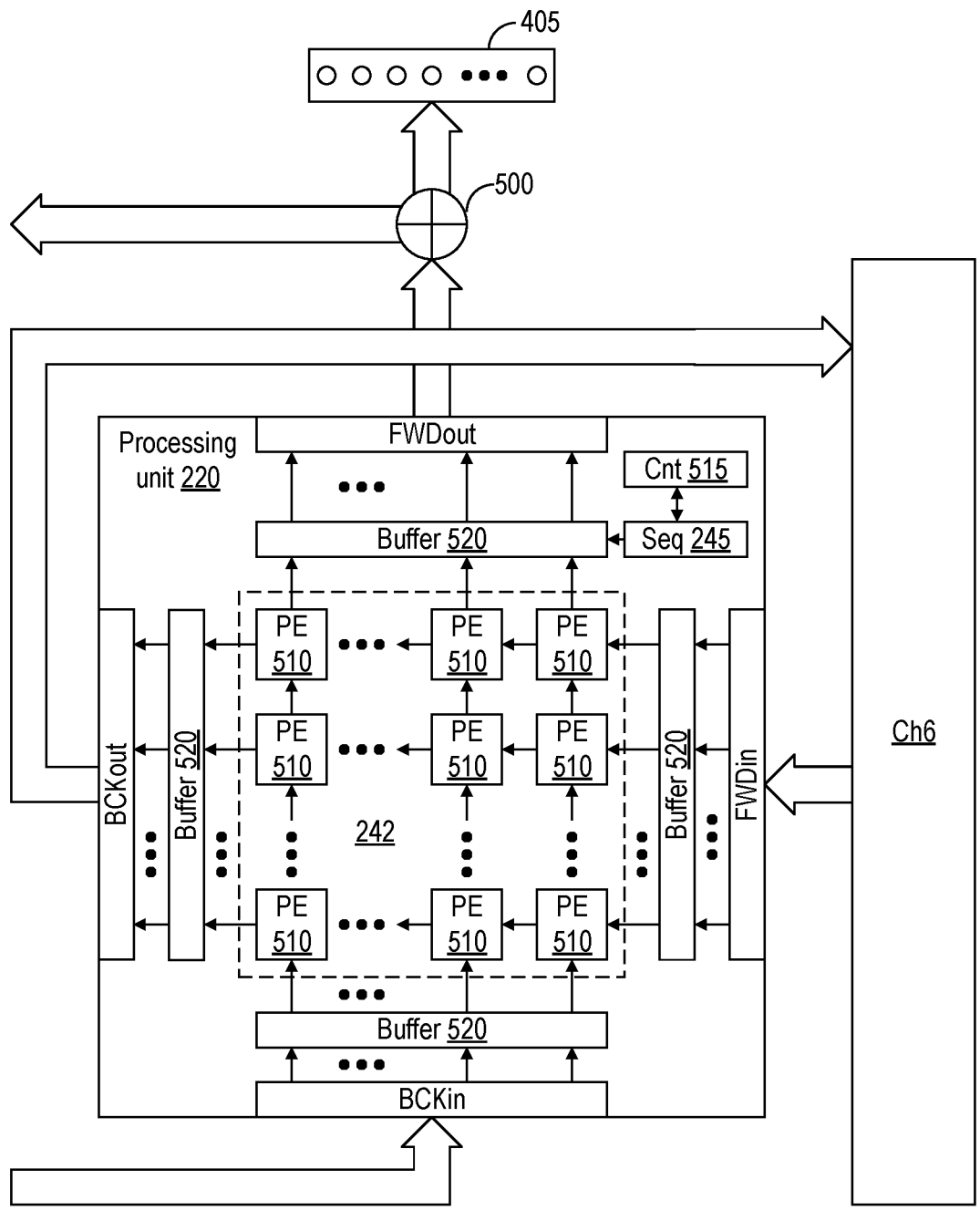
FIG. 5 depicts an embodiment of a processing unit 220 for a neural network.

FIG. 5 depicts a processing unit 220 communicatively coupled to a via field 405. A configurable switch 500 allows processing unit 220 to send data either to a downstream processing unit, as illustrated in FIG. 3, or to send requests and data to DRAM banks 225 using inter-die connections 400, as illustrated in FIG. 4.

Processing unit 220 includes an array 242 of processing elements 510. Processing unit 220 can be a "tile," a geometric area on an IC die that encompasses a circuit that is or is largely replicated to form a tessellation of tiles. Switch 500 is depicted as outside of the tile for ease of illustration but switch 500 and the related connections can be integrated with other tile elements within the tile boundaries. Memory transactions that take place over via field 405 can be managed by sequencer 245 with access to a tile counter 515 or to a counter external to the tile.

Scratchpad and buffer logic 520 between the input and output nodes of array 242 can be included to store and buffer input and output signals. Sequencer 245 is of a simple and efficient class of memory controller that generates sequences of addresses to step though a microprogram, in this case to stream operands from and to memory banks 135 in underlying memory dies 210. Sequencer 245 can also issue refresh instructions to addresses maintained in counter 515.

Figure 6:
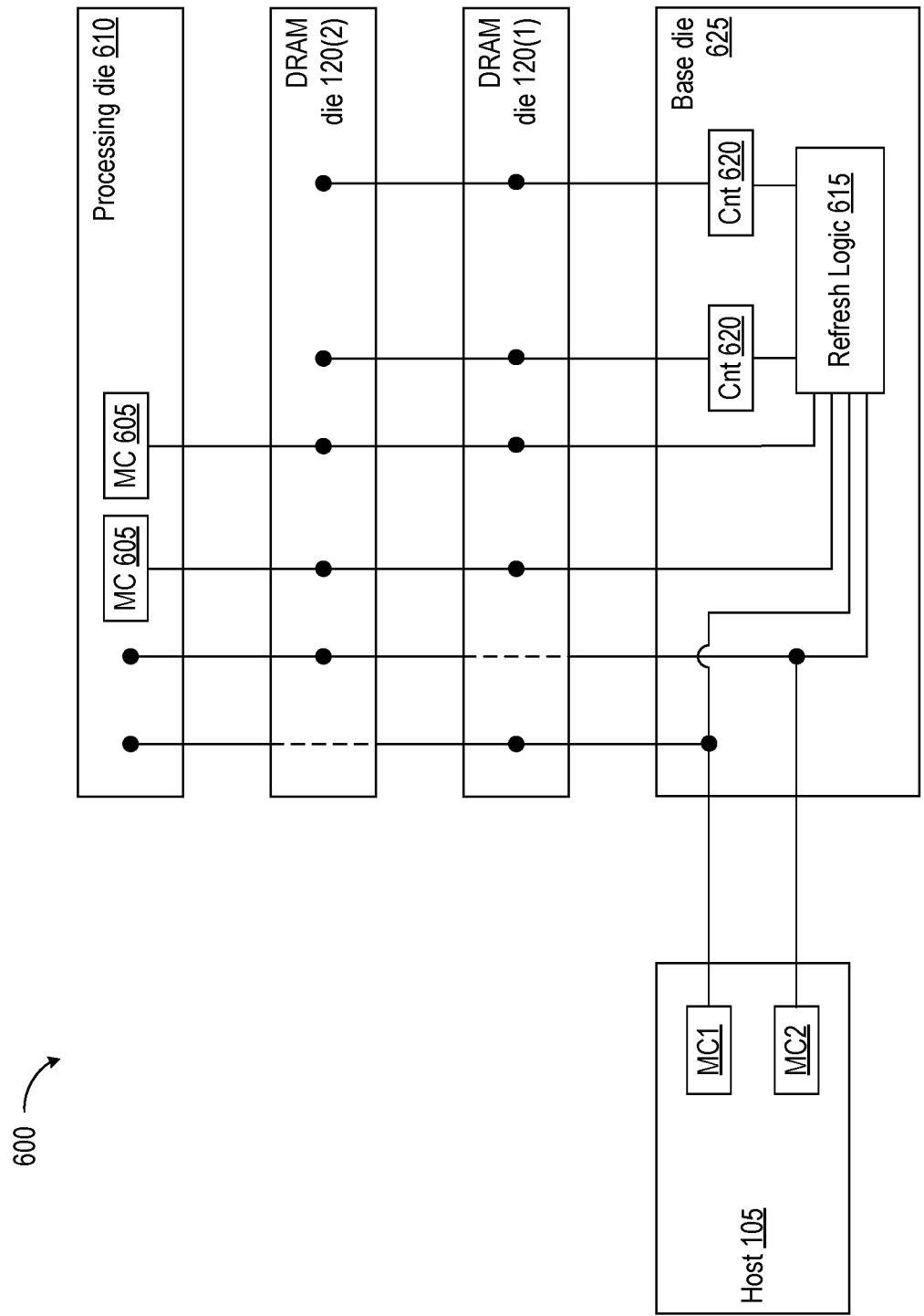
FIG. 6 depicts a memory system 600 in accordance with an embodiment in which refresh operations for a stack of dram dies 120 can be directed by a host 105 or memory controllers MC 605 on a processing die 610.

FIG. 6 depicts a memory system 600 in accordance with an embodiment in which refresh operations for a stack of dram dies 120 can be directed by a host 105 or memory controllers MC 605 on a processing die 610. Refresh logic 615 and refresh counters 620 similar to those introduced in FIG. 1 are integrated with a base die 625 rather than on processing die 610. This mode allows the stack to support refresh operations absent processing die 610. DRAM dies 120 and base die 625 can thus function as high-bandwidth memory with or without the capability afforded by processing die 610, and thus advantageously address a larger market. Connection points that communicate requests and addresses are highlighted. Dashed lines indicate information paths that traverse a die without a communicative coupling to intra-die components. Refresh operations can be supported in the manner detailed previously so a detailed discussion is omitted.

Figure 7:
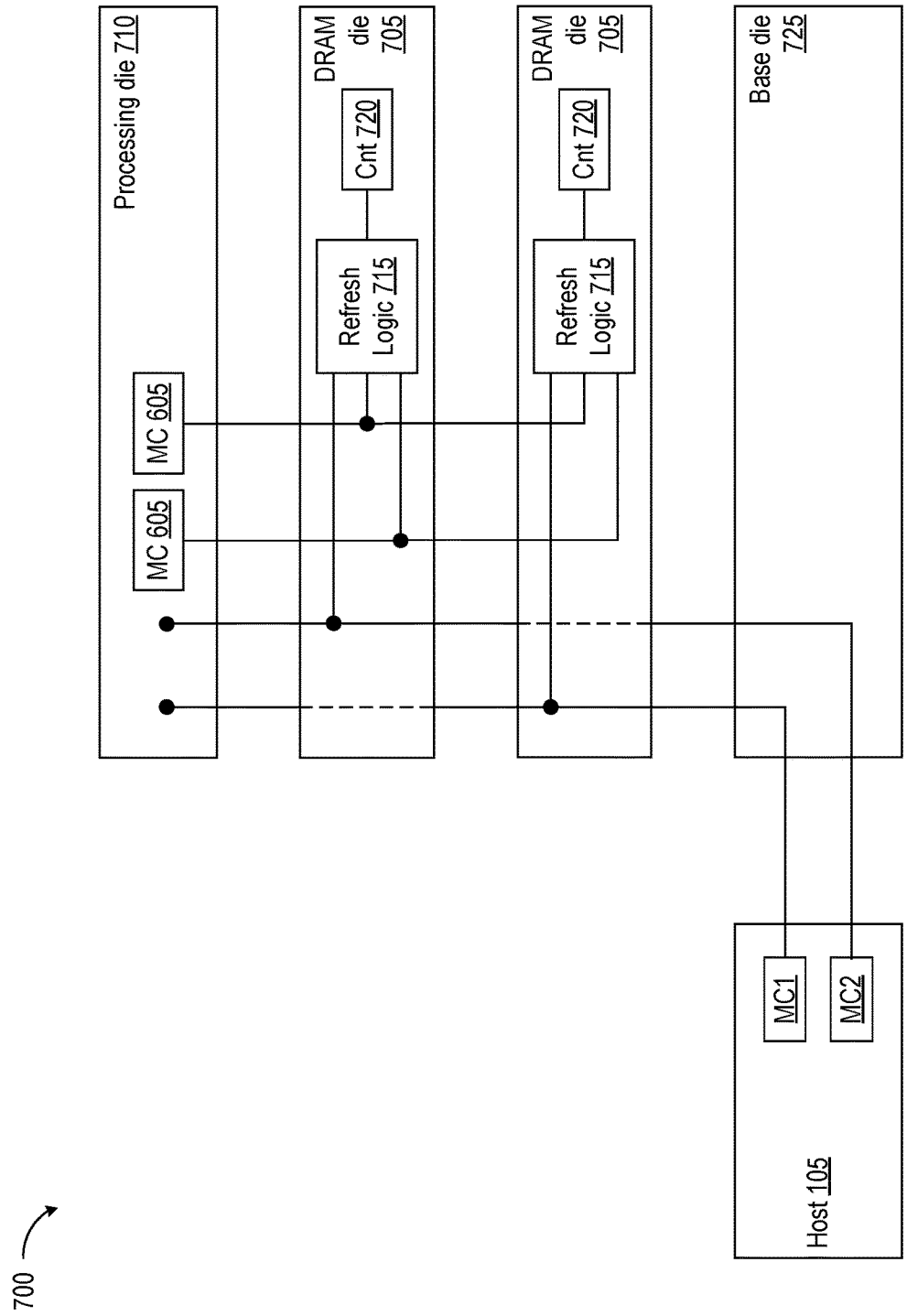
FIG. 7 depicts a memory system 700 in accordance with another embodiment.

FIG. 7 depicts a memory system 700 in accordance with another embodiment. In this case, refresh operations for a stack of DRAM dies 705 can be directed by a host 105 or memory controllers MC 605 in a processor die 710 with the assistance of refresh logic 715 and refresh counters 720 integrated into each DRAM die 705. Base die 725 is thus relatively simplified and may be omitted.

Figure 8:
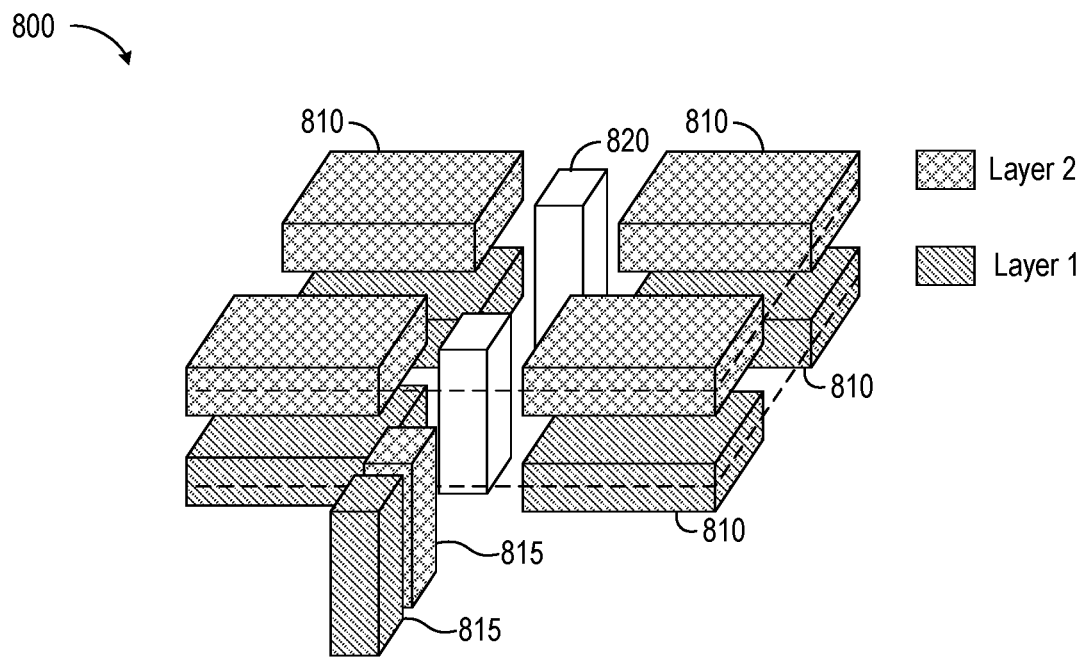
FIG. 8 depicts two refresh modes 800 and 805 for an HBM memory system with two DRAM dies (horizontal layers) and two DRAM slices (vertical stacks).
Figure 8:
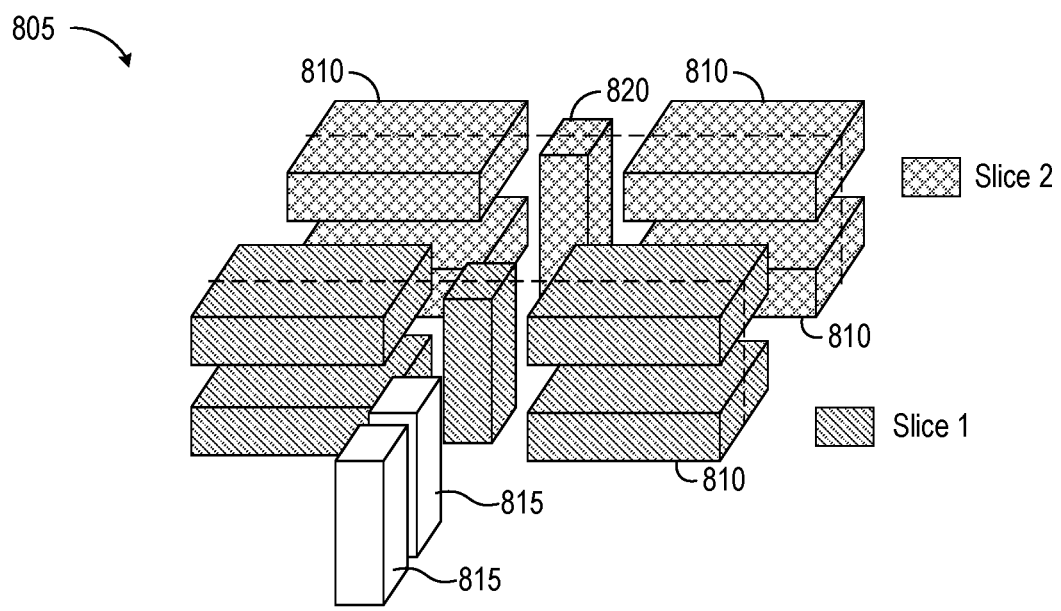

FIG. 8 depicts two refresh modes 800 and 805 for an HBM memory system with two DRAM dies (horizontal layers) and two DRAM slices (vertical stacks). Each layer includes four like-shaded blocks of memory 810, each block representing one or more DRAM banks. Each layer of blocks can be accessed via one of two HBM pseudo channels 815 that are shaded to match the corresponding blocks of memory 810. An external host (not shown) can independently access blocks in each layer from the corresponding pseudo channel 815 to perform read, write, and refresh transactions. A pair of vertical channels 820 are not used in mode 800 and are thus not shaded. Turning to mode 805, pseudo channels 815 are not used and thus are not shaded; instead, integrated controllers (e.g. controller 235 of FIG. 2) can communicate via vertical channels 820—slices—with like-shaded vertical collections of blocks to perform read, write, and refresh transactions.

The memory system can transition between modes 800 and 805 without losing state. An external host may write training data into DRAM via pseudo channels 815 in mode 800, turn control over to internal controllers to develop and store model parameters in mode 805, and take back control to read the model parameters in mode 800. Control of refresh operations should transition between controllers without loss of data. Memory systems in accordance with some embodiments thus incorporate refresh-management circuitry that manages refresh addresses and timing while transitioning between refresh modes.

Figure 9:
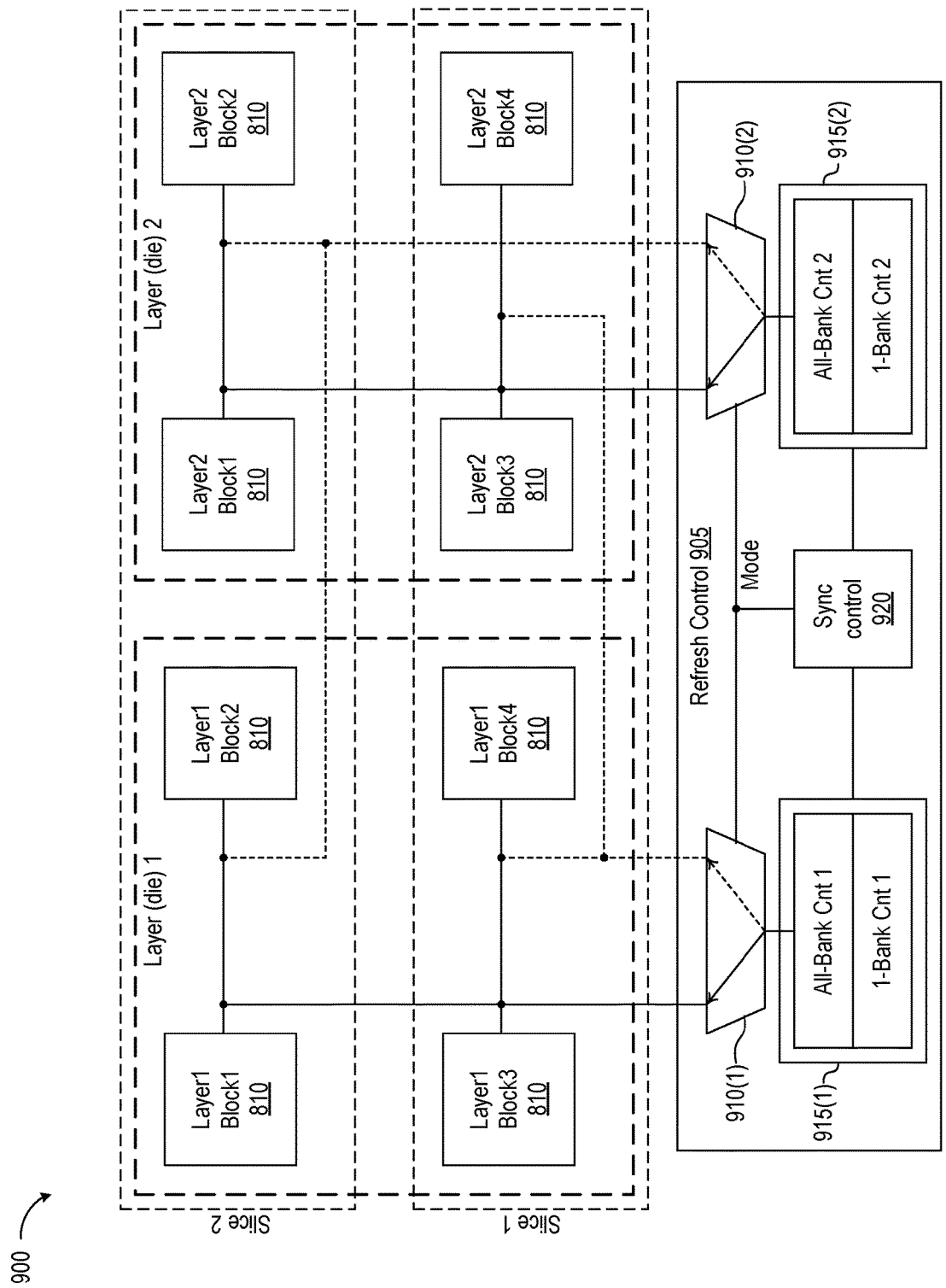
FIG. 9 depicts a memory system 900 that includes refresh control circuitry 905 for managing modes 800 and 805 of FIG. 8.

FIG. 9 depicts a memory system 900 that includes refresh control circuitry 905 for managing modes 800 and 805 of FIG. 8. Memory blocks 810 of FIG. 8 are labeled to illustrate their respective block and slice membership. Memory system 900 is functionally similar to system 100 of FIG. 1 but includes support for refresh-counter synchronization to manage transitions between modes 800 and 805 without loss of data. Refresh control circuitry 905 includes multiplexers 910(1) and 910(2) and respective refresh counters 915(1) and 915(2) that issue bank addresses for refresh operations to banks within blocks 810 of respective DRAM layers or slices, in dependence upon the selected one of modes 800 or 805.

Whatever the mode, refresh control 905 allows the selected layers or slices to be managed independently. This independence improves performance because refresh operations directed to one subset of the DRAM (e.g., a layer or a slice) do not prevent the other subset from servicing memory requests. Different levels of refresh granularity can be used, but this embodiment supports per-bank refresh using counters 915(1,2). Each counter is actually two counters that support nested loops, one that the sequences through all bank addresses and the other that steps through row addresses within a selected bank. This and other refresh schemes are well known so a detailed discussion is omitted.

Refresh control 905 provides refresh scheduling flexibility that improves speed performance by allowing memory controllers to issue refresh commands early (pulled in) or late (postponed) to prioritize read and write memory requests. In one embodiment, for example, memory system 900 complies with the JEDEC DDR4 SDRAM Standard, which allows a memory controller to postpone or pull in up to eight all-bank refresh commands. Control is handed off between modes, however, with each counter serving a different set of memory banks. If counters 915(1) and 915(2) are too far out of synchronization when transitioning between modes, then the banks subject to the new controller are in danger of losing data. Otherwise a pulled-in address counter could issue addresses to a bank previously getting its addresses from a postponed address counter, thereby creating a hole in the address space even if the number of refreshes is correct. For example, the refresh addresses for the upper left memory block 810 (Layer 1, Block 1) are provided by counter 915(1) in mode 800 and by counter 915(2) in mode 805. If the count applied by counter 915(2) after a mode change is too far out from the count from counter 915(1) then the data in layer 1, block 1, may be lost. Synchronization control 920 synchronizes counters 915(1,2) to address this problem. In one embodiment, for example, when refresh control 920 receives a request to switch modes, it completes ongoing single-bank cycles and synchronizes the addresses of counters 915(1,2) by stalling refresh requests for pulled-in counters and awaiting postponed counters to catch up. The internal or external memory controller assigned to the memory associated with each counter 915(1,2) then takes control of memory access. In other embodiments, each collection of DRAM banks that remains together in the various modes is provided with its own counter.

Figure 10:
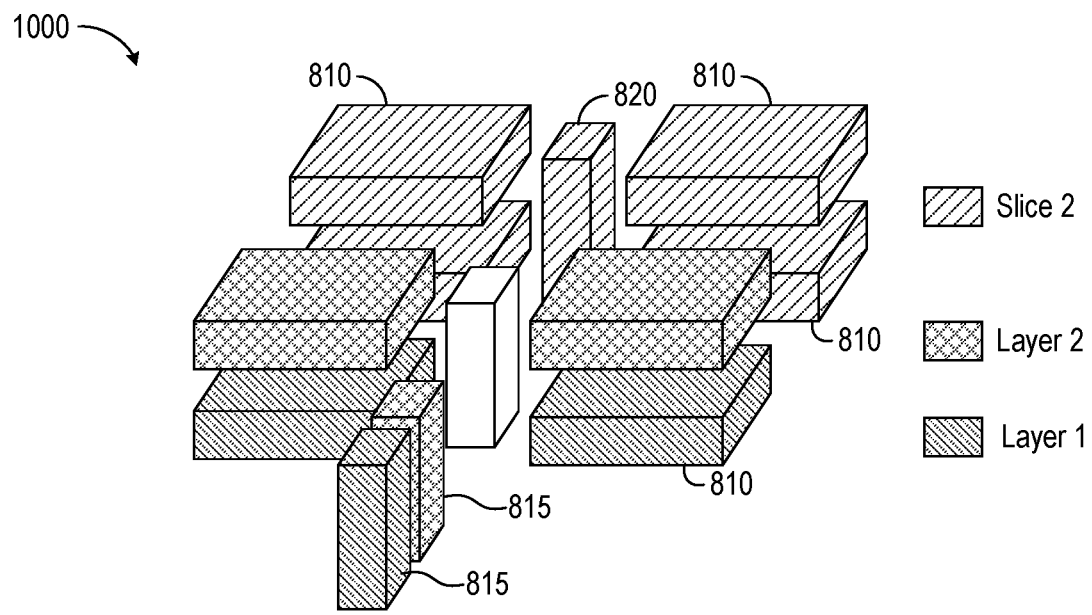
FIG. 10 depicts two additional refresh modes 1000 and 1005 using the same memory system illustrated in FIG. 8.
Figure 10:
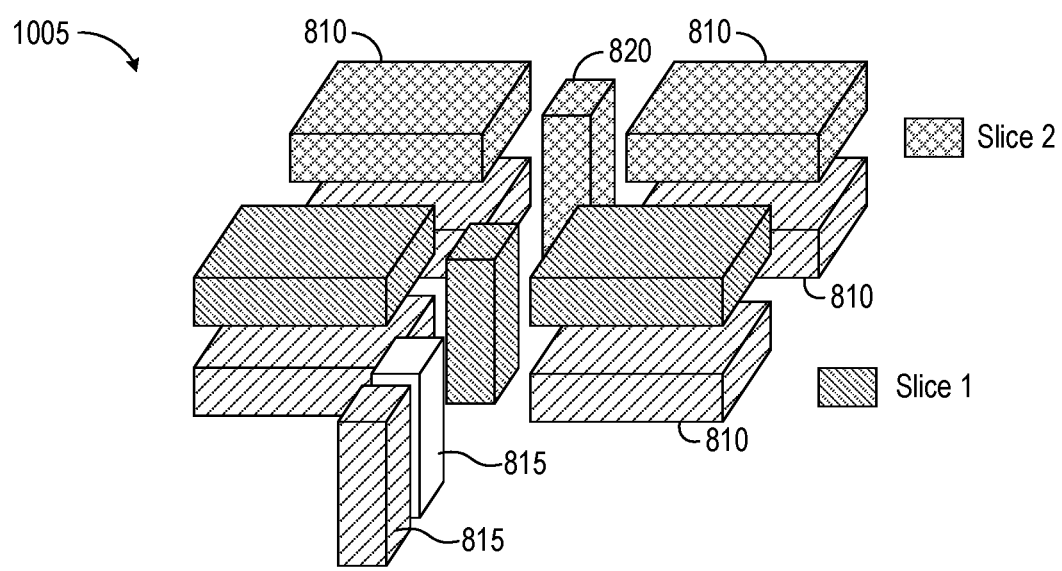

FIG. 10 depicts two additional refresh modes 1000 and 1005 using the same memory system illustrated in FIG. 8. In mode 1000, half of each layer of memory blocks 810 can be accessed using one of two HBM pseudo channels 815 that are shaded to match the corresponding blocks of memory 810, and a slice of four memory block 810 can be accessed using one of the two vertical channels 820. In mode 1005, the bottom layer of memory blocks 810 can be accessed using one pseudo channel 815 and half of the memory blocks 810 on the top layer can be accessed using each of the two vertical channels 820. Each of these modes allows memory access, including refresh control, to be managed by a combination of external and internal controllers.

Modes 1000 and 1005 can be implemented using a refresh scheme similar to what is conventionally termed "partial-array self-refresh" (PASR). PASR is an operational mode in which refresh operations are not performed across the entire memory but are instead limited to specific banks where data retention is required. Data outside of the active portion of the memory is not retained, and the resulting reduction in refresh operations saves power. For example, PASR may be used to refresh a subset of memory rows used to respond to baseband memory requests required to maintain connectivity to a local cellular network while other functionality is inactivated to preserve power. Methods and circuits in support of PASR are adapted in support of mixed-access modes of the type illustrated here. Considering mode 1000, slice 2 is in service of one of vertical channels 820 but is essentially "inactive" from the perspective of an external host employing pseudo channels 815 to access four of blocks 810 of the remaining slice. A memory system in mode 1000 could thus employ PASR-type methods and circuits to manage the memory available to an external host. Likewise, PASR-type methods and circuits can support internal memory controllers that have access to a subset of the memory blocks 810 along each vertical channel 820.

Figure 11:
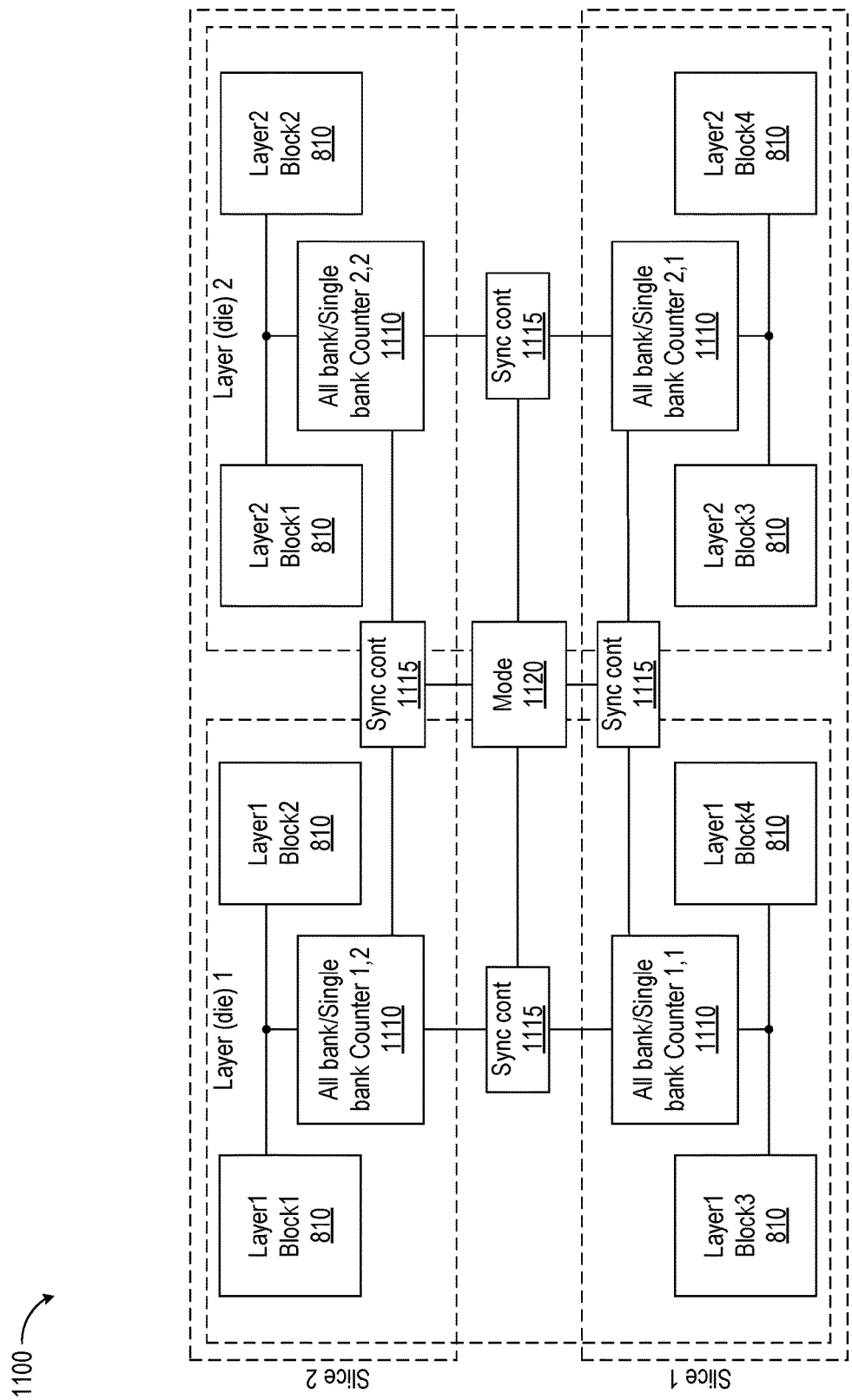
FIG. 11 depicts a memory system 1100 that includes refresh control circuitry for managing modes 1000 and 1005 of FIG. 10.

FIG. 11 depicts a memory system 1100 that includes refresh control circuitry for managing modes 1000 and 1005 of FIG. 10. Each of modes 1000 and 1005 partitions memory such that up to three channels have concurrent access. Additional refresh counters 1110 and synchronization circuits 1115 are included to manage those counters during mode switching and responsive to a mode register 1120 that can be loaded by e.g. an external host. When mode register 1120 is loaded with a new mode value, each synchronization circuit 1115 completes ongoing single-bank cycles and synchronizes the addresses of counters 1110 by stalling refresh requests for pulled-in counters and awaiting postponed counters to catch up. The internal or external memory controller assigned to the memory associated with each counter 1110 then takes control of memory access.

Figure 12:
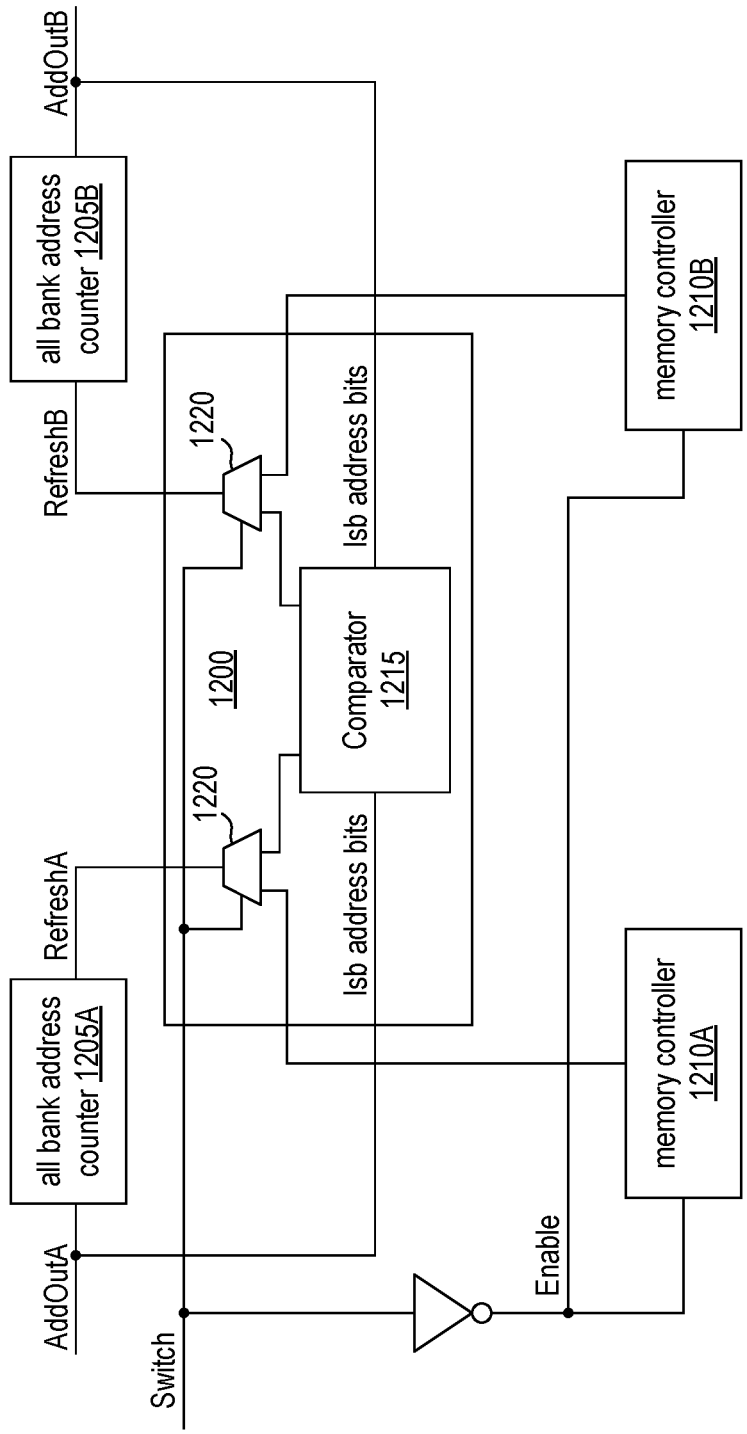
FIG. 12 depicts an example of sync control logic 1200 to show how control of a pair of refresh counters 1205A and 1205B is switched from a pair of memory controllers 1210A and 1210B to a third controller (not shown), such as an external host controller.

FIG. 12 depicts an example of sync control logic 1200 to show how control of a pair of refresh counters, all-bank address counters 1205A and 1205B, is switched from a pair of memory controllers 1210A and 1210B to a third controller (not shown). Control logic 1200 includes an address comparator 1215 and two multiplexers 1220. While memory controllers 1210A and 1210B are in control, multiplexers 1220 allow controllers 1210A and 1210B to issue refresh instructions and independently advance their respective counters 1205A and 1205B accordingly. Refresh registers 1205A and 1205B thus maintain separate addresses AddOutA and AddOutB for the memory under control of respective controllers 1210A and 1210B. Comparator 1215 monitors the least-significant bits (LSBs) of refresh addresses AddOutA and AddOutB to keep track of the difference between them. If the access mode is switched, illustrated here by the assertion of a signal Switch, independent controllers 1210A and 1210B are disabled and comparator 1215 issues refresh signals RefreshA or RefreshB of a number sufficient to catch up whichever of address counters 1205A and 1205B is behind.

Figure 13:
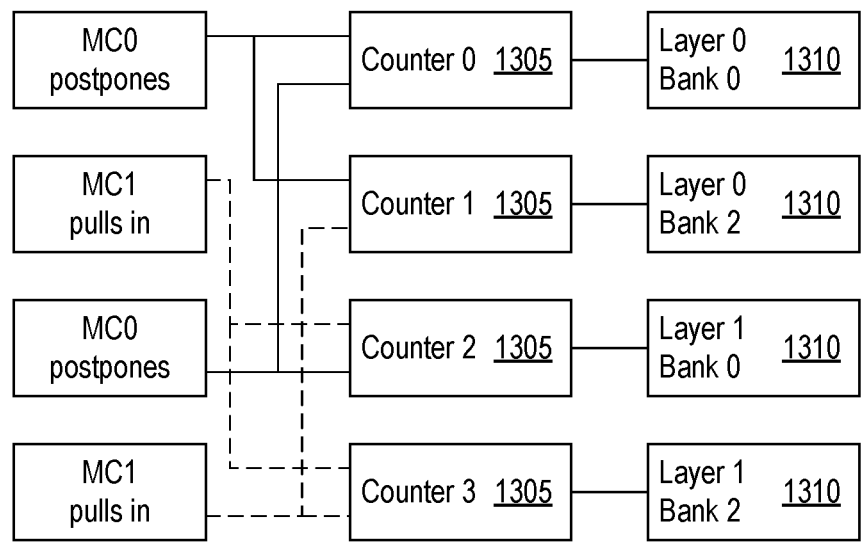
FIG. 13 is a block diagram 1300 illustrating refresh-counter synchronization in accordance with an embodiment in which a refresh counter 1305 is provided for each of four independently accessible unit of memory 1310 (e.g. a bank or banks).

FIG. 13 is a block diagram 1300 illustrating refresh-counter synchronization in accordance with an embodiment in which a refresh counter 1305 is provided for each of four independently accessible units of memory 1310 (e.g. a bank or banks). Memories 1305 can be accessed together in different refresh modes but each counter 1305 is permanently associated with the same memory 1310. Refresh addresses thus do not require synchronization when transitioning between refresh modes.

Timing differences due to postponing or pulling in refresh transactions are settled before mode switching. Otherwise, postponed or pulled-in addresses could accumulate over time. Each memory controller MCO and MCI keeps its status with respect to pulled-in or postponed refreshes. In that way, addresses will not be out-of-sync by more than four times the number of allowed pull-ins or postponements (one counter 1305 twice ahead, the other twice back). Some embodiments run refreshes at an increased rate. For example, upon mode switching the newly assigned memory controller can run refresh transactions twice through the available address space at twice the regular rate. Stopping the refresh counters at zero in the second round synchronizes all refresh counters without loss of data. In other embodiments synchronization of the refresh addresses is accomplished by setting all addresses before mode switching to the value of the most postponed counter. These embodiments use additional logic to compare and set refresh addresses, and some rows would be refreshed more often than necessary, but no refreshes are required to catch up before switching between modes.

While the invention has been described with reference to specific embodiments thereof, it will be evident that various modifications and changes may be made thereto without departing from the broader spirit and scope of the invention. For example, additional stacked accelerator dies can be included with more or fewer DRAM dies, the accelerator die or a subset of the accelerator tiles can be replaced with or supplemented by one or more graphics-processing die or tiles, and the DRAM die or dies can be supplemented with different types of dynamic or non-volatile memory. Variations of these embodiments will be apparent to those of ordinary skill in the art upon reviewing this disclosure. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. An integrated circuit (IC) device comprising:
   stacked and bonded memory dies, each memory die having:
   a first memory-die request interface to a first set of memory banks; and
   a second memory-die request interface to a second set of memory banks;
   wherein each of the first and second sets of memory banks include volatile memory cells;
   a controller die bonded to the memory dies, the controller die including:
   a first controller to issue first refresh requests to the first memory-die request interfaces of the bonded memory dies; and
   a second controller to issue second refresh requests to the second memory-die request interfaces of the bonded memory dies to issue second refresh requests to the second set of memory banks:
   a first refresh-address counter to issue first bank addresses; and
   a first bank-address demultiplexer having:
   a first demultiplexer input port coupled to the first refresh-address counter to receive the first bank addresses;
   a first demultiplexer output port coupled to the first and second memory-die request interfaces of a first of the memory dies; and
   a second demultiplexer output port coupled to the first memory-die request interfaces of the first of the memory dies and a second of the memory dies.

2. The device of claim 1, further comprising:
   a first intra-die request interface coupled to the first and second memory-die request interfaces of a first of the memory dies, the first intra-die request interface to issue first intra-die refresh requests to the first and second sets of memory banks on the first of the memory dies; and
   a second intra-die request interface coupled to the first and second memory-die request interfaces of a second of the memory dies, the second intra-die request interface to issue second intra-die refresh requests to the first and second sets of memory banks on the second of the memory dies.

3. The device of claim 1, further comprising:
   a second refresh-address counter to issue second bank addresses; and
   a second bank-address demultiplexer having:
   a second demultiplexer input port coupled to the first refresh-address counter to receive the first bank addresses;
   a third demultiplexer output port coupled to the first and second memory-die request interfaces of a second of the memory dies; and
   a fourth demultiplexer output port coupled to the second memory-die request interfaces of the first of the memory dies and the second of the memory dies.

4. The device of claim 3, wherein the controller die includes the first and second refresh-address counters.

5. The device of claim 1, further comprising a mode register coupled to the first bank-address demultiplexer, the mode register to store a value controlling the first bank-address demultiplexer to convey the first bank addresses to one of the first and second demultiplexer output ports.

6. The device of claim 1, further comprising:
   a first refresh-address counter to issue first bank addresses to the first memory-die request interface of at least one of the memory dies;
   a second refresh-address counter to issue second bank addresses to the second memory-die request interface of the at least one of the memory dies; and
   synchronization logic coupled to the first refresh-address counter and the second refresh-address counter, the synchronization logic to synchronize the first bank addresses with the second bank addresses.

7. The device of claim 6, wherein:
   the first refresh-address counter to issue the first bank addresses to the first memory-die request interface of the memory dies; and
   the second refresh-address counter to issue the second bank addresses to the second memory-die request interface of the memory dies.

8. The device of claim 6, further comprising a control die stacked and bonded to the memory dies, the control die including at least one of the first refresh-address counter and the second refresh-address counter.

9. The device of claim 8, the control die further comprising a first processing unit to issue first refresh requests to the first refresh-address counter and a second processing unit to issue second refresh requests to the second refresh-address counter.

10. The device of claim 9, wherein each of the first processing unit and the second processing unit includes an array of processing units.

11. An integrated-circuit die comprising:
    a first refresh-address counter to selectively couple to one of a first dynamic, random-access memory and a second dynamic, random-access memory to issue first refresh addresses;
    a second refresh-address counter selectively coupled to one of the first dynamic, random-access memory and the second dynamic, random-access memory to issue second refresh addresses; and synchronization control circuitry, coupled to the first refresh-address counter and the second refresh-address counter, to synchronize the first refresh addresses with the second refresh addresses.

12. The integrated-circuit die of claim 11, further comprising:

a first memory controller selectively coupled to the first refresh-address counter and the second refresh-address counter; and a second memory controller selectively coupled to the first refresh-address counter and the second refresh-address counter.

13. The integrated-circuit die of claim 11, wherein the first dynamic, random-access memory is integrated on a first die and the second dynamic, random- access memory is integrated on a second die.

14. The integrated-circuit die of claim 13, wherein the first counter and the second refresh-address counter are integrated on a third die.

15. The integrated-circuit die of claim 14, wherein the first die, the second die, and the third die are bonded in a stack.

16. The integrated-circuit die of claim 15, further comprising:

a first memory controller external to the stack and selectively coupled to the first refresh-address counter and the second refresh-address counter; and a second memory controller integrated on the third die and selectively coupled to the first refresh-address counter and the second refresh-address counter.

17. The integrated-circuit die of claim 16, wherein the third die comprises an array of processing elements communicatively coupled to the second memory controller.

18. The integrated-circuit die of claim 17, wherein the array of processing elements comprises a neural network.

19. A method of refreshing first dynamic, random-access memory and second dynamic, random-access memory, the method comprising:

conveying first refresh addresses to the first dynamic, random-access memory from a first address counter responsive to a first memory controller;

conveying second refresh addresses to the second dynamic, random-access memory from a second address counter responsive to a second memory controller;

synchronizing the first refresh addresses with the second refresh addresses;

after the synchronizing:

conveying the first refresh addresses to the second dynamic, random-access memory from the first address counter responsive to the second memory controller; and conveying the second refresh addresses to the first dynamic, random-access memory from the second address counter responsive to the first memory controller.

* * * * *